(12) United States Patent
Lerner et al.

(10) Patent No.: US 11,047,039 B2
(45) Date of Patent: Jun. 29, 2021

(54) SUBSTRATE CARRIER HAVING HARD MASK

(71) Applicant: APPLIED MATERIALS, INC., Santa Clara, CA (US)

(72) Inventors: Alexander Lerner, San Jose, CA (US); Kim Vellore, San Jose, CA (US); Ami Sade, Sunnyvale, CA (US); Steven Sansoni, Livermore, CA (US); Andrew Constant, Cupertino, CA (US); Kevin Moraes, Fremont, CA (US); Roey Shaviv, Palo Alto, CA (US); Niranjan Kumar, Cupertino, CA (US); Jeffrey Brodine, Los Gatos, CA (US); Michael Karazim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 273 days.

(21) Appl. No.: 16/232,496

(22) Filed: Dec. 26, 2018

(65) Prior Publication Data
US 2019/0211442 A1     Jul. 11, 2019

Related U.S. Application Data

(60) Provisional application No. 62/614,777, filed on Jan. 8, 2018.

(51) Int. Cl.
*C23C 14/50* (2006.01)
*C23C 14/04* (2006.01)
*C23C 14/24* (2006.01)

(52) U.S. Cl.
CPC ............ *C23C 14/50* (2013.01); *C23C 14/042* (2013.01); *C23C 14/24* (2013.01)

(58) Field of Classification Search
CPC ....... C23C 14/50; C23C 14/042; C23C 14/24; H01L 21/67336; E03F 5/107; E03F 5/0405; E03F 2005/0417
USPC .......................................................... 361/234
See application file for complete search history.

(56) References Cited

U.S. PATENT DOCUMENTS

2010/0163404 A1\* 7/2010 De .................... H01L 21/02266
204/192.12

\* cited by examiner

*Primary Examiner* — Dharti H Patel
(74) *Attorney, Agent, or Firm* — Moser Taboada

(57) ABSTRACT

Substrate carrier apparatus having a hard mask are disclosed herein. In some embodiments, a substrate carrier apparatus includes a carrier body having a support surface to support a substrate; and a mask assembly disposed above the support surface. The mask assembly includes an annular frame disposed atop the support surface; and a hard mask coupled to and disposed within the annular frame above the support surface, wherein the hard mask includes one or more openings arranged in a predetermined pattern and disposed through the hard mask, and wherein the hard mask includes a plurality of spacer elements extending from a bottom surface of the hard mask.

20 Claims, 2 Drawing Sheets

SUBSTRATE CARRIER HAVING HARD MASK

CROSS-REFERENCE TO RELATED APPLICATIONS

This application claims benefit of U.S. provisional application Ser. No. 62/614,777, filed Jan. 8, 2018, which is herein incorporated by reference in its entirety.

FIELD

Embodiments of the present disclosure generally relate to substrate processing systems, and more specifically to a substrate carrier having a hard mask.

BACKGROUND

Masks (e.g., hard masks) are typically utilized in semiconductor processing to selectively deposit material on a substrate. A mask will have a predetermined pattern of openings formed through the mask to allow material to be deposited on the substrate below the mask only at positions corresponding to the openings. However, placement and removal of such masks is typically done in atmosphere. The inventors have discovered that, after a substrate has been processed using the mask, material that has been deposited on the mask often forms particles upon exiting the vacuum environment of the processing chamber or cluster tool.

Accordingly, the inventors provide herein an improved substrate carrier having a hard mask.

SUMMARY

Substrate carrier apparatus having a hard mask are disclosed herein. In some embodiments, a substrate carrier apparatus includes a carrier body having a support surface to support a substrate; and a mask assembly disposed above the support surface. The mask assembly includes an annular frame disposed atop the support surface; and a hard mask coupled to and disposed within the annular frame above the support surface, wherein the hard mask includes one or more openings arranged in a predetermined pattern and disposed through the hard mask, and wherein the hard mask includes a plurality of spacer elements extending from a bottom surface of the hard mask.

In some embodiments, a substrate carrier apparatus includes a carrier body having a support surface to support a substrate; and a mask assembly disposed above the support surface. The mask assembly includes an annular frame disposed atop the support surface; a hard mask coupled to and disposed within the annular frame above the support surface, wherein the hard mask includes one or more openings arranged in a predetermined pattern and disposed through the hard mask, and wherein the hard mask includes a plurality of spacer elements extending from a bottom surface of the hard mask to maintain a predetermined gap between the hard mask and the substrate between about 20 μm and about 50 μm, when the substrate is disposed atop the support surface; and a flexure element coupled to the annular frame and configured to compensate for substrate thickness variations.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of the scope of the disclosure, for the disclosure may admit to other equally effective embodiments.

Figure 1:
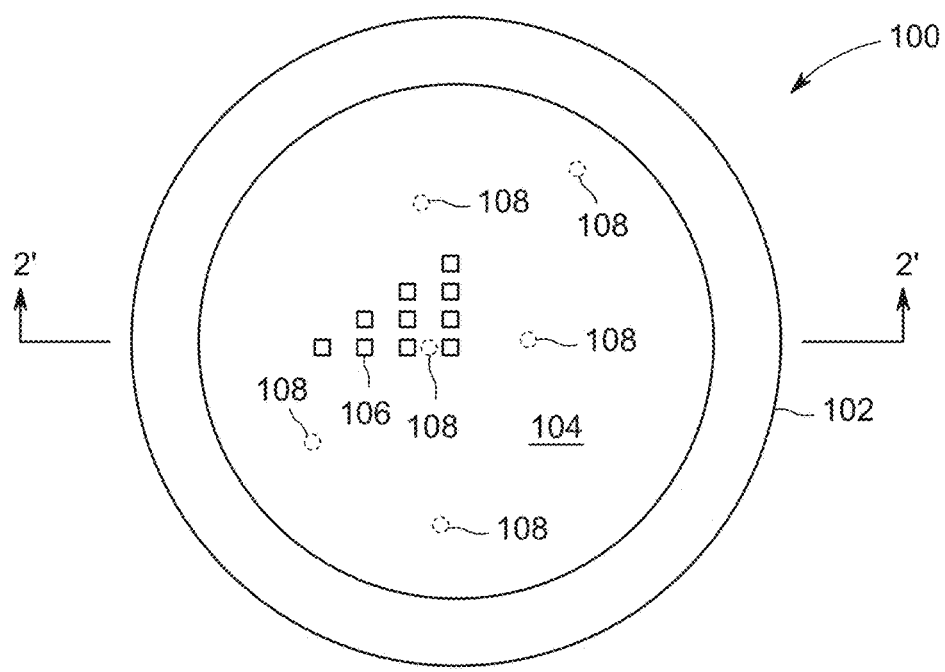
FIG. 1 depicts a schematic top view of substrate carrier apparatus in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Substrate carrier apparatuses having a hard mask are disclosed herein. The inventive substrate carrier apparatus includes a carrier on which a substrate can be placed and mask assembly which can placed atop the carrier such that the hard mask of the mask assembly is disposed above the substrate. The inventive substrate carrier apparatus advantageously enables the placement and removal of a hard mask above the substrate in a vacuum environment. For example, a chamber configured to receive the substrate on the carrier and place/remove the mask assembly above the substrate may be coupled to a cluster tool such that the mask assembly is always in a vacuum environment. As a result, particle generation on the hard mask is advantageously minimized or substantially eliminated, which prevents contamination of substrates and processing chambers which come into contact with the hard mask.

Figure 2:
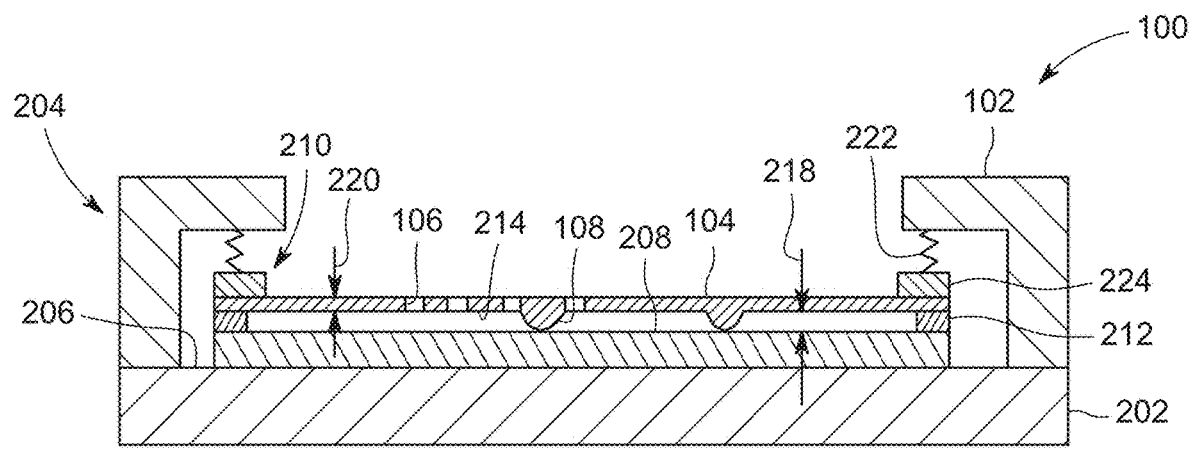
FIG. 2 depicts a cross-sectional view of a substrate carrier apparatus taken along line 2-2' in FIG. 1 in accordance with some embodiments of the present disclosure.

The following description will be made with reference to FIGS. 1 and 2. FIG. 1 depicts a top view of a substrate carrier apparatus 100 in accordance with some embodiments of the present disclosure. FIG. 2 depicts a cross-section view of the substrate carrier apparatus 100 of FIG. 1 taken along line 2-2'. In some embodiments, the substrate carrier apparatus 100 includes a carrier body 202 and a mask assembly 204 above. As depicted in FIG. 2, the carrier body 202 includes a support surface 206 to support a substrate 208. In some embodiments, the carrier body 202 is formed of a non-metallic material such as, for example, alumina, silicon, etc. In some embodiments, the support surface 206 may be textured to minimize or substantially prevent the substrate 208 from moving along the support surface 206 during handling of the substrate carrier apparatus 100. The mask assembly 204 is disposed above the support surface 206 and includes an annular frame 102 disposed atop the support surface 206 and a hard mask 104 coupled to the annular frame via a flexure element 210. As used herein, the term annular is not limited to circular closed shapes and may include other closed shapes such as, for example, rectangular, polygonal, etc. The hard mask 104 is disposed within the annular frame 102 such that the hard mask 104 sits directly above the substrate 208.

The hard mask 104 includes one or more openings 106 arranged in a predetermined pattern and disposed through the hard mask 104 to selectively allow material to be deposited through the one or more openings 106 onto the substrate 208 at positions corresponding to the one or more openings 106. The hard mask 104 further includes a plurality of spacer elements 212 extending from a bottom surface 214 of the hard mask 104 to maintain a predetermined gap 218 between the hard mask 104 and the substrate 208. In some embodiments, the plurality of spacer elements 212 may be bonded to the bottom surface 214. In some embodiments, the plurality of spacer elements 212 may alternatively be deposited on the bottom surface 214. In some embodiments, the hard mask 104 may alternatively include an annular spacer (not shown) instead of a plurality of spacers. In some embodiments, the predetermined gap 218 is between about 20 μm and about 50 μm. In some embodiments, the predetermined gap is about 25 μm. In some embodiments, the hard mask 104 has a thickness 220 between about 20 μm and about 50 μm.

The flexure element 210 couples the annular frame 102 to the hard mask 104. The flexure element 210 is also coupled to the hard mask 104 at an end of the flexure element 210 opposite the annular frame 102. In some embodiments, the flexure element 210 may be welded to both the annular frame 102 and the hard mask 104. In some embodiments, the flexure element 210 may alternatively be brazed or glued to both the annular frame 102 and the hard mask 104. As depicted in FIG. 2, in some embodiments, the flexure element 210 includes a plurality of springs 222 coupled (e.g., via welding, brazing, or adhesive) to a corresponding plurality of coupling bodies 224. In some embodiments, the flexure element 210 may alternatively include elastomeric members instead of the springs. Substrates (e.g., substrate 208) typically have thickness variations across the substrate. The flexure element 210 advantageously compensates for such thickness variations by allowing for a scenario in which the hard mask 104 is not perfectly horizontal while still ensuring that the annular frame 102 sits flush against the support surface 206.

Because of the relatively small thickness of the hard mask 104, the hard mask 104 is pliable. As such, when the spacer elements 212 and the coupling bodies 224 are coupled (i.e., bonded) to the hard mask 104, the hard mask 104 is tensioned before the coupling to ensure that the hard mask 104 is as horizontal as possible when disposed atop the substrate 208. During deposition, the hard mask 104 may undergo thermal expansion and, as a result, may begin to sag. As such, in some embodiments, the hard mask 104 may include one or more protrusions 108 extending from the bottom surface 214 compensate for such sagging. The one or more protrusions 108 are arranged at predetermined locations and configured to prevent deflection of the hard mask towards the substrate 208 beyond a predetermined deflection. For example, each protrusion 108 may be sized only to allow a maximum local deflection of about 5 μm. However, the protrusions 108 may be arranged and configured to allow any desired deflection amount.

Figure 3:
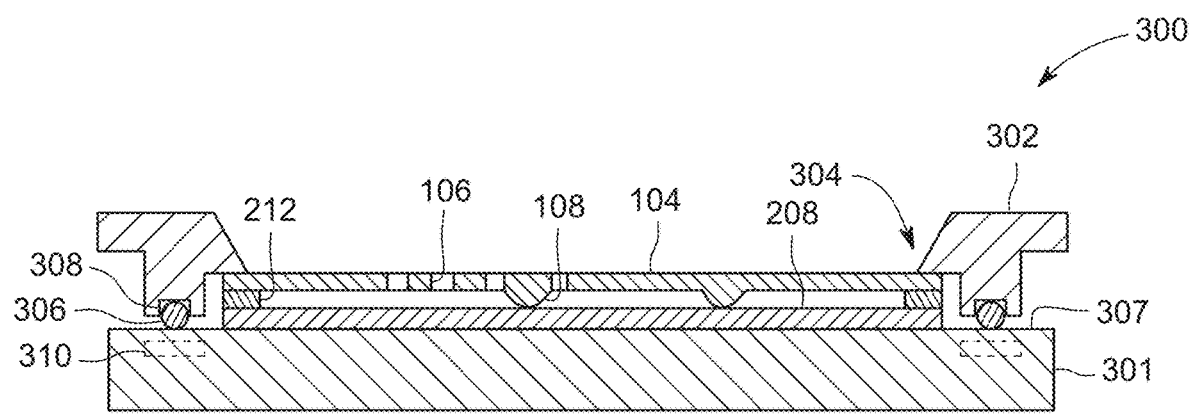
FIG. 3 depicts a cross-sectional view of a substrate carrier apparatus in accordance with some embodiments of the present disclosure.

FIG. 3 illustrates depicts a cross-sectional view of a substrate carrier apparatus 300 in accordance with some embodiments of the present disclosure. The substrate carrier apparatus 300 includes similar components as those described above with respect to the substrate carrier apparatus 100. As such, a description of the similar components is omitted here. In some embodiments, the substrate carrier apparatus 300 includes an annular frame 302 having a radially inward extending lip 304, which is coupled to an upper surface of the hard mask 104. In some embodiments, the flexure element includes one or more elastomeric elements 306 disposed within corresponding openings/slots 308 such that the elastomeric elements 306 are disposed between the annular frame 302 and a support surface 307 of a carrier body 301. In some embodiments, the flexure element may alternatively include an annular elastomeric element (not shown) disposed within a corresponding annular channel (not shown). In some embodiments, the annular frame may be formed of an invariable metallic material such as, for example, a nickel-iron alloy. In some embodiments, one or more magnets 310 may be disposed in the carrier body 301 beneath the support surface 307 in an area beneath the annular frame 302 to bias the annular frame 302 towards the carrier body 301.

Figure 4:
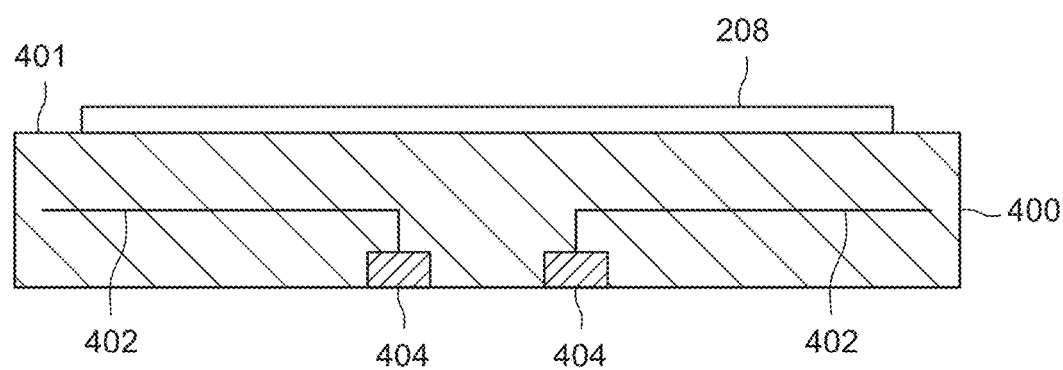
FIG. 4 illustrates a schematic cross-sectional view of a carrier body for use with a carrier apparatus in accordance with some embodiments of the present disclosure.

FIG. 4 illustrates a schematic cross-sectional view of a carrier body 400 for use with a carrier apparatus (e.g., substrate carrier apparatus 100 or 300 described above) in accordance with some embodiments of the present disclosure. The carrier body 400 is a portable electrostatic chuck (ESC) configured to hold the substrate atop the a support surface 401 of the carrier body 400 using electrostatic forces. In some embodiments, the carrier body 400 may include one or more electrodes 402 and one or more corresponding electrical leads 404 configured to couple electric power to the one or more electrodes 402 to electrostatically chuck the substrate onto the support surface 401. After power is applied to the one or more electrodes 402 to chuck the substrate onto the support surface 401, the electrostatic chucking forces remain with the carrier body 400 and the substrate even after power is no longer supplied to the one or more electrodes 402 (i.e., during transfer of the carrier apparatus to/from the processing chamber). As such, the substrate is advantageously prevented from moving during transfer of the carrier apparatus during handling.

To remove the substrate from the carrier, power having an opposite charge than the chucking power is supply to the one or more electrical leads 404 to allow the substrate to be removed. The carrier body 400 may include any necessary structure to facilitate placement and removal of the substrate onto/from the support surface 401. For example, the carrier body 400 may include lift pin holes (not shown) to allow lift pins to raise and lower the substrate onto/from the support surface or, alternatively, grooves (not shown) to allow an end effector to pass underneath the substrate for placement and removal of the substrate.

While the foregoing is directed to embodiments of the present disclosure, other and further embodiments of the disclosure may be devised without departing from the basic scope thereof.

The invention claimed is:

1. A substrate carrier apparatus, comprising:
   a carrier body having a support surface to support a substrate; and
   a mask assembly disposed above the support surface, the mask assembly comprising:
      an annular frame disposed atop the support surface; and
      a hard mask coupled to and disposed within the annular frame above the support surface, wherein the hard mask includes one or more openings arranged in a predetermined pattern and disposed through the hard mask, and wherein the hard mask includes a plurality of spacer elements extending from a bottom surface of the hard mask.

2. The substrate carrier apparatus of claim 1, further comprising:

a flexure element coupled to the annular frame and configured to compensate for substrate thickness variations.

3. The substrate carrier apparatus of claim 2, wherein the flexure element includes a plurality of springs, each of which is coupled to the annular frame at a first end, and a corresponding plurality of coupling bodies, each of which is coupled to a corresponding one of the plurality of springs at a second end of the spring opposite the annular frame, and wherein the plurality of coupling bodies are coupled to an upper surface of the hard mask.

4. The substrate carrier apparatus of claim 2, wherein the flexure element comprises one or more elastomeric elements disposed between the annular frame and the support surface.

5. The substrate carrier apparatus of claim 1, wherein the plurality of spacer elements are configured to maintain a predetermined gap between the hard mask and the substrate between about 20 μm and about 50 μm, when the substrate is disposed atop the support surface.

6. The substrate carrier apparatus of claim 1, further comprising:
one or more magnets disposed in the carrier body beneath the support surface in an area beneath the annular frame to bias the annular frame towards the carrier body.

7. The substrate carrier apparatus of claim 1, wherein the hard mask further comprises one or more protrusions extending from the bottom surface of the hard mask and configured to prevent deflection of the hard mask towards the substrate beyond a predetermined deflection.

8. The substrate carrier apparatus of claim 1, wherein the carrier body is formed of a non-metallic material.

9. The substrate carrier apparatus of claim 1, wherein a thickness of the hard mask is between about 20 μm and about 50 μm.

10. The substrate carrier apparatus of claim 1, wherein the support surface is textured.

11. The substrate carrier apparatus of claim 1, wherein the carrier body is a portable electrostatic chuck.

12. A substrate carrier apparatus, comprising:
a carrier body having a support surface to support a substrate; and
a mask assembly disposed above the support surface, the mask assembly comprising:
an annular frame disposed atop the support surface;
a hard mask coupled to and disposed within the annular frame above the support surface, wherein the hard mask includes one or more openings arranged in a predetermined pattern and disposed through the hard mask, and wherein the hard mask includes a plurality of spacer elements extending from a bottom surface of the hard mask to maintain a predetermined gap between the hard mask and the substrate between about 20 μm and about 50 μm, when the substrate is disposed atop the support surface; and
a flexure element coupled to the annular frame and configured to compensate for substrate thickness variations.

13. The substrate carrier apparatus of claim 12, wherein the flexure element includes a plurality of springs, each of which is coupled to the annular frame at a first end, and a corresponding plurality of coupling bodies, each of which is coupled to a corresponding one of the plurality of springs at a second end of the spring opposite the annular frame, and wherein the plurality of coupling bodies are coupled to an upper surface of the hard mask.

14. The substrate carrier apparatus of claim 12, wherein the flexure element comprises one or more elastomeric elements disposed between the annular frame and the support surface.

15. The substrate carrier apparatus of claim 12, further comprising:
one or more magnets disposed in the carrier body beneath the support surface in an area beneath the annular frame to bias the annular frame towards the carrier body.

16. The substrate carrier apparatus of claim 12, wherein the hard mask further comprises one or more protrusions extending from the bottom surface of the hard mask and configured to prevent deflection of the hard mask towards the substrate beyond a predetermined deflection.

17. The substrate carrier apparatus of claim 12, wherein the carrier body is formed of a non-metallic material.

18. The substrate carrier apparatus of claim 12, wherein a thickness of the hard mask is between about 20 μm and about 50 μm.

19. The substrate carrier apparatus of claim 12, wherein the support surface is textured.

20. The substrate carrier apparatus of claim 12, wherein the carrier body is a portable electrostatic chuck.

\* \* \* \* \*